(12) United States Patent
Leobandung

(10) Patent No.: US 9,112,031 B2
(45) Date of Patent: Aug. 18, 2015

(54) REDUCED RESISTANCE FINFET DEVICE WITH LATE SPACER SELF ALIGNED CONTACT

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 14/075,033

(22) Filed: Nov. 8, 2013

(65) Prior Publication Data
US 2015/0129988 A1 May 14, 2015

(51) Int. Cl.
*H01L 29/78* (2006.01)
*H01L 21/36* (2006.01)
*H01L 29/66* (2006.01)

(52) U.S. Cl.
CPC .......... *H01L 29/785* (2013.01); *H01L 29/6681* (2013.01)

(58) Field of Classification Search
CPC ................ H01L 29/4966; H01L 21/28088
USPC ........................................................ 257/288
See application file for complete search history.

(56) References Cited

U.S. PATENT DOCUMENTS

| | | | |
|---|---|---|---|
| 6,495,437 B1 * | 12/2002 | Yu ................................ | 438/591 |
| 7,833,889 B2 | 11/2010 | Pillarisetty et al. | |
| 7,951,657 B2 | 5/2011 | Cheng et al. | |
| 8,043,920 B2 * | 10/2011 | Chan et al. .................... | 438/300 |
| 8,212,336 B2 | 7/2012 | Goebel et al. | |
| 8,492,228 B1 * | 7/2013 | Leobandung et al. ........ | 438/275 |
| 8,575,013 B2 * | 11/2013 | Baars et al. ................... | 438/585 |
| 8,722,523 B2 * | 5/2014 | Schloesser et al. ........... | 438/585 |
| 8,921,904 B2 * | 12/2014 | Baars et al. ................... | 257/288 |
| 9,006,805 B2 * | 4/2015 | Liao et al. ..................... | 257/288 |
| 2008/0237634 A1 | 10/2008 | Dyer et al. | |
| 2011/0018063 A1 | 1/2011 | Doyle et al. | |
| 2011/0204384 A1 | 8/2011 | Cheng et al. | |
| 2012/0309171 A1 | 12/2012 | Lu et al. | |
| 2012/0326236 A1 | 12/2012 | Chang et al. | |
| 2013/0099295 A1 * | 4/2013 | Baars et al. ................... | 257/288 |
| 2015/0001627 A1 * | 1/2015 | Zang et al. .................... | 257/365 |

* cited by examiner

*Primary Examiner* — Earl Taylor
(74) *Attorney, Agent, or Firm* — Scully, Scott, Murphy & Presser, P.C.; Louis J. Percello, Esq.

(57) ABSTRACT

Embodiments include a method of fabricating a reduced resistance finFET device comprising providing a fin in a semiconductor substrate. A dummy gate is formed over a portion of the fin such that the dummy gate does not initiate selective epitaxy. A source/drain region is formed on the fin such that the source/drain region directly contacts the dummy gate. The dummy gate is replaced with a replacement metal gate structure that directly contacts the source/drain region. A portion of the fin that includes a portion of the source/drain region is replaced with a contact material.

9 Claims, 11 Drawing Sheets

REDUCED RESISTANCE FINFET DEVICE WITH LATE SPACER SELF ALIGNED CONTACT

FIELD OF THE INVENTION

The present invention relates generally to the fabrication of semiconductor devices, and more particularly to the fabrication of a finFET device.

BACKGROUND OF THE INVENTION

Field effect transistors (FETs) can be semiconductor devices fabricated on a bulk semiconductor substrate or on a silicon-on-insulator (SOI) substrate. FET devices generally consist of a source, a drain, a gate, and a channel between the source and drain. The gate is separated from the channel by a thin insulating layer, typically of silicon oxide, called the field or gate oxide. A voltage drop generated by the gate across the oxide layer induces a conducting channel between the source and drain thereby controlling the current flow between the source and the drain. Current integrated circuit designs use complementary metal-oxide-semiconductor (CMOS) technology that use complementary and symmetrical pairs of p-type and n-type metal oxide semiconductor field effect transistors (MOSFETs) for logic functions.

The integrated circuit industry is continually reducing the size of the devices, increasing the number of circuits that can be produced on a given substrate or chip. It is also desirable to increase the performance of these circuits, increase the speed, and reduce the power consumption. A three dimensional chip fabrication approach, such as a finFET, has been developed for semiconductor devices. A finFET is a non-planar FET. The "fin" is a narrow, vertical silicon base channel between the source and the drain. The fin is covered by the thin gate oxide and surrounded on two or three sides by an overlying gate structure. The multiple surfaces of the gate, allow for more effective suppression of "off-state" leakage current. The multiple surfaces of the gate also allow enhanced current in the "on" state, also known as drive current. These advantages translate to lower power consumption and enhanced device performance.

Polysilicon has been a preferred material for use as a gate electrode due to its thermal resistive properties and ability to withstand subsequent high temperature processes. Due to the higher resistivity of the polysilicon verses metal materials, a polysilicon gate may operate at much slower speeds than gates made of a metallic material. A further performance enhancement uses a replacement metal gate (RMG). This process removes the original polysilicon gate and replaces it with a metal gate material. A high-k dielectric can also be used as the gate oxide as a part of the RMG process.

Process challenges exist as the dimensions of the devices decrease, some now falling below 20 nm. As the cross-sectional area of the circuits decrease, the electrical resistance increases. The increased electrical resistance can have detrimental effects on the circuit performance.

SUMMARY

Embodiments of the present invention provide a reduced resistance finFET device and include a method of fabricating the same. In the method of fabrication of the reduced resistance finFET device, a fin is provided in a semiconductor substrate. A dummy gate is formed over a portion of the fin such that the dummy gate does not initiate selective epitaxy. A source/drain region is formed on the fin such that the source/drain region directly contacts the dummy gate. The dummy gate is replaced with a replacement metal gate structure that directly contacts the source/drain region. A portion of the fin that includes a portion of the source/drain region is replaced with a contact material. In one embodiment, a spacer is formed on at least one sidewall of the gate structure, and over at least a portion of the source/drain region. In another embodiment, the replacement metal gate structure includes a high-k material that directly contacts the source/drain region. The replacement metal gate structure may also include a workfunction material over the high-k layer.

DETAILED DESCRIPTION

Figure 1:
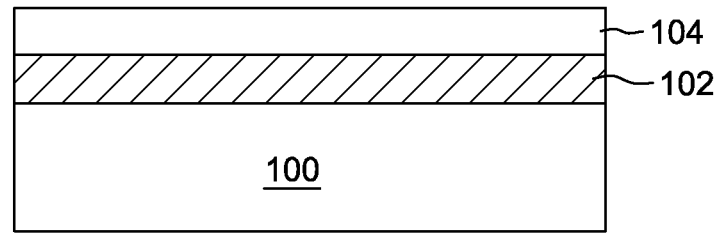
FIG. 1 depicts a cross-sectional view of a semiconductor substrate upon which a finFET structure may be fabricated, in accordance with embodiments of the invention.

Embodiments of the present invention generally provide a reduced resistance finFET device with a late spacer, wherein, forming a gate spacer following the deposition of the source and drain material can act to reduce the channel length of the finFET device, thereby reducing the electrical resistance of the device. Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Referring now to the figures, FIG. 1 depicts a cross-sectional view of semiconductor substrate 100 upon which a finFET structure may be fabricated, in accordance with embodiments of the invention. Semiconductor substrate 100 is a semiconductor material, preferably a silicon-containing material including, but not limited to, silicon, silicon germanium alloys, silicon carbon alloys, or silicon germanium carbon alloys. In various embodiments, the finFET structure is built on a silicon-on-insulator (SOI) substrate in which semiconductor substrate 100 includes buried oxide layer 102 and semiconductor layer 104 on buried oxide layer 102. In various embodiments, semiconductor layer 104 is single crystal silicon with a typical thickness of about 5 nm to about 40 nm. It should be appreciated by one skilled in the art that the invention is not limited to SOI construction, and that other semiconductor substrates may be used, for example, silicon-containing materials including, but not limited to, silicon, silicon germanium alloys, silicon carbon alloys, or silicon germanium carbon alloys.

Figure 2A:
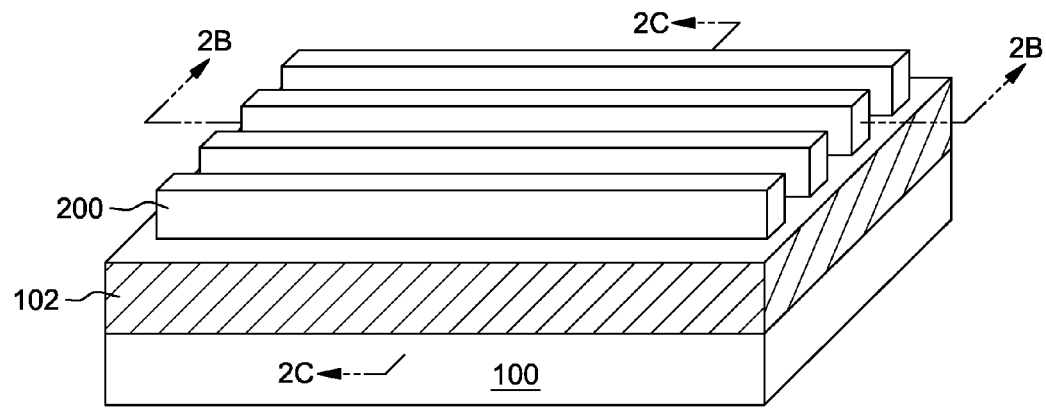
FIG. 2A depicts a perspective view of an example of the fins of a finFET structure, in accordance with an embodiment of the present invention.
Figure 2B:
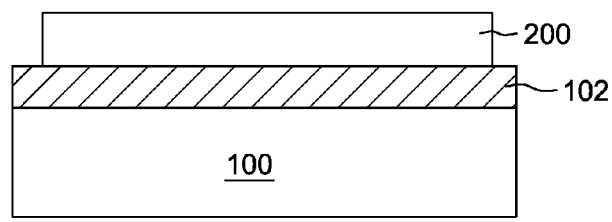
FIG. 2B is a cross-sectional view of FIG. 2A taken through section line 2B-2B.
Figure 2C:
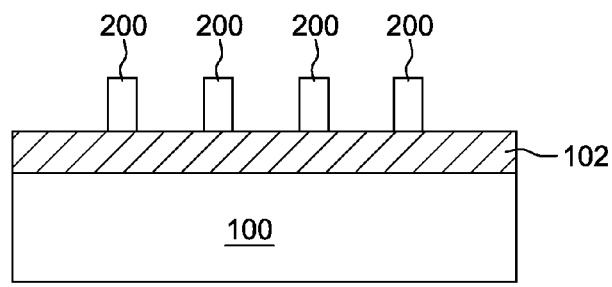
FIG. 2C is a cross-sectional view of FIG. 2A taken through section line 2C-2C.

FIG. 2A depicts a perspective view of an example of the fins of a finFET structure in accordance with an embodiment of the present invention. Fin 200 can be fabricated from semiconductor layer 104 using standard lithographic and etching processes known to someone skilled in the art. The height of fin 200 is determined by the thickness of semiconductor layer 104 of FIG. 1. Semiconductor layer 104 or fin 200 can be further etched to reduce the thickness as determined by the design requirements of the device. The width of fin 200 is typically about 2 nm to about 40 nm. FIG. 2B is a cross-sectional view of FIG. 2A taken through section line 2B-2B. FIG. 2C is a cross-sectional view of FIG. 2A taken through section line 2C-2C.

Figure 3A:
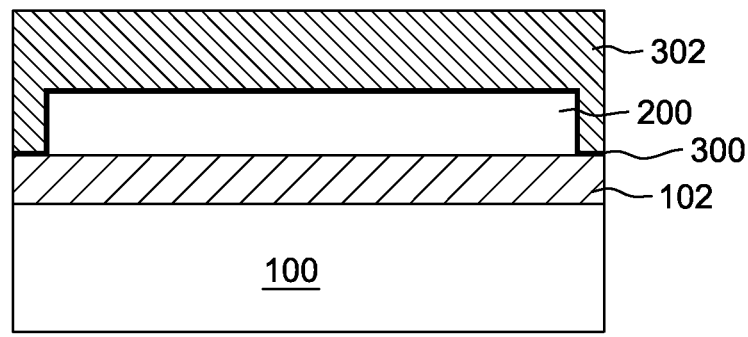
FIG. 3A and 3B depict two cross-sectional views of the deposition of an oxide layer followed by the deposition of a dummy gate layer, in accordance with an embodiment of the present invention.
Figure 3B:
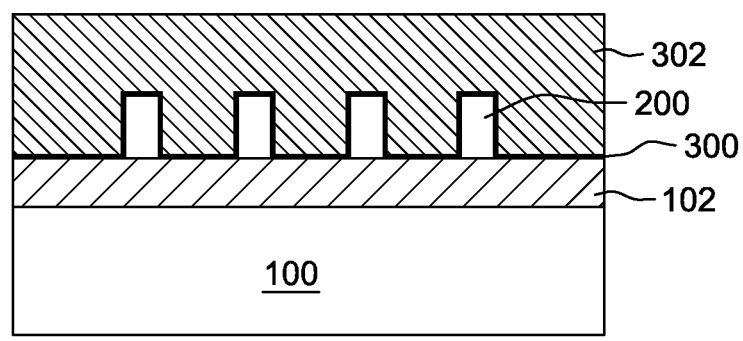

FIGS. 3A and 3B depict the deposition of oxide layer 300 followed by the deposition of dummy gate layer 302 in accordance with an embodiment of the present invention. Oxide layer 300 may be formed by thermally oxidizing the exposed surface of fin 200, or may be deposited onto fin 200 using, for example, chemical vapor deposition (CVD) or atomic layer deposition (ALD). In various embodiments of the invention, oxide layer 300 is silicon dioxide ($SiO_2$) of a thickness of about 1 nm to about 5 nm, and acts to protect fin 200 during subsequent gate formation. In various embodiments, dummy gate layer 302 is deposited over oxide layer 300 and over fin 200 using, for example, low pressure chemical vapor deposition (LPCVD), and is about 30 nm to about 200 nm thick, preferably about 100 nm thick. Following the deposition, dummy gate layer 302 can be planarized to facilitate subsequent gate formation steps, using for example chemical-mechanical planarization (CMP). CMP may use a combination of chemical etching and mechanical polishing to smooth the surface and even out any irregular topography. Dummy gate layer 302 is composed of a material that can act as a dummy gate in a replacement metal gate (RMG) process, for example, silicon nitride (SiN), and further, does not initiate crystal growth in a process such as selective epitaxy. Other dummy gate layer 302 materials include, but are not limited to hafnium oxide ($HfO_2$) or other dielectric materials.

Figure 4A:
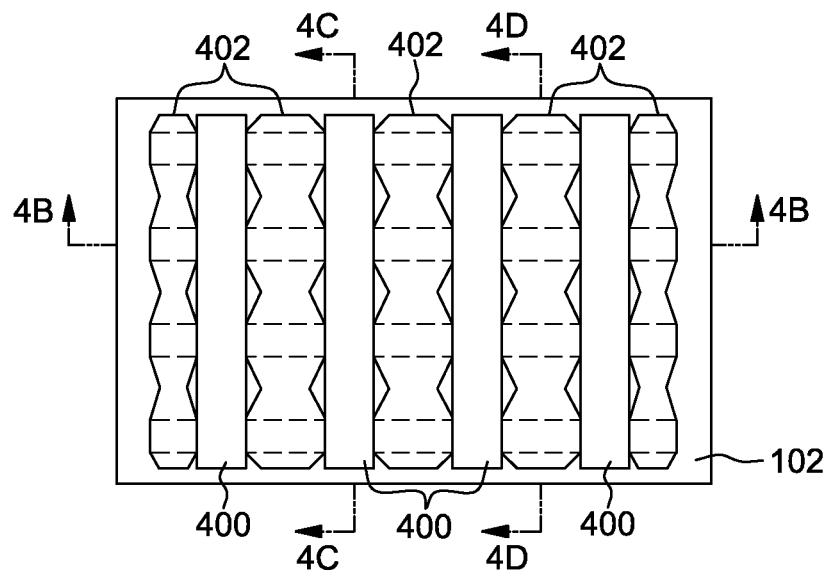
FIG. 4A depicts a planar view of the finFET structure subsequent to formation of a dummy gate and deposition of an epitaxial layer, in accordance with an embodiment of the present invention.
Figure 4B:
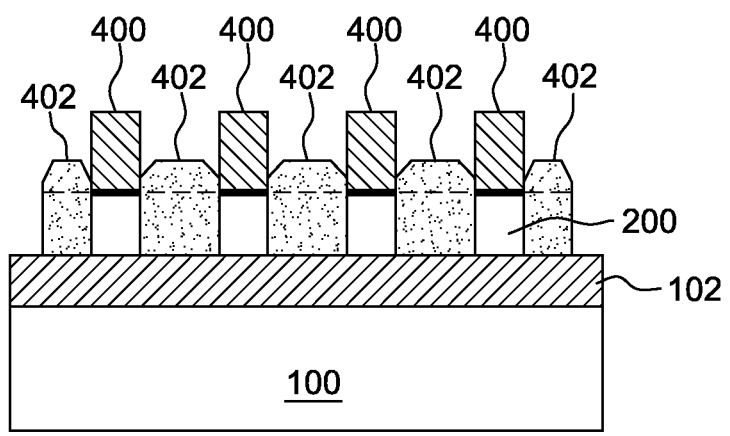
FIG. 4B is a cross-sectional view of FIG. 4A taken through section line 4B-4B that shows an epitaxial layer deposited on portions of a fin.
Figure 4C:
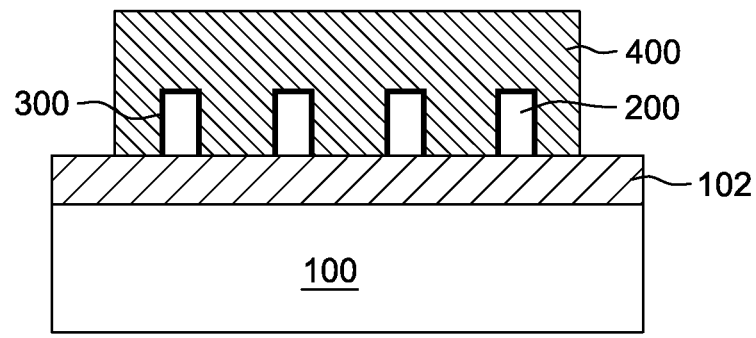
FIG. 4C is a cross-sectional view of FIG. 4A taken through section line 4C-4C that shows a dummy gate formed over a fin.

FIG. 4A depicts a planar view of the finFET structure subsequent to formation of dummy gate 400 and deposition of epitaxial layer 402, in accordance with an embodiment of the present invention. Dummy gate 400 is created by etching dummy gate layer 302 of FIG. 3A using, for example, anisotropic dry etching. In various embodiments, standard lithographic processes are used to define the pattern of dummy gate 400 in a layer of photoresist (not shown) deposited on gate layer 302 of FIG. 3A. It is understood that intermediate hard mask layers (not shown) may be used between the photoresist layer and dummy gate layer 302. The gate pattern may then be formed in dummy gate layer 302 by removing dummy gate layer 302 from the areas not protected by the pattern in the photoresist layer using, for example, reactive ion etching (RIE). RIE uses chemically reactive plasma, generated by an electromagnetic field, to remove various materials. A person of ordinary skill in the art will recognize that the type of plasma used will depend on the material of which dummy gate layer 302 is composed, or that other etch processes, e.g., wet chemical etch, laser ablation, etc., may be used. FIG. 4C is a cross-sectional view of FIG. 4A taken through section line 4C-4C that shows dummy gate 400 formed over fin 200 and oxide layer 300.

Figure 4D:
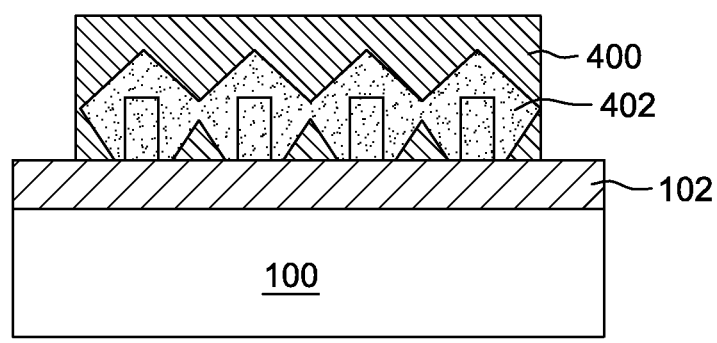
FIG. 4D is a cross-sectional view of FIG. 4A taken through section line 4D-4D that shows the faceted growth of an epitaxial layer over a fin.

After dummy gates 400 are formed, epitaxial layer 402 is deposited on the exposed portions of fin 200. In various embodiments, a doped epitaxial layer of n-type or p-type silicon may be grown on the surface of fin 200 using, for example, selective epitaxy, wherein the epitaxial layer grows only from the exposed portion of fin 200 and does not grow from oxide layer 102 or from dummy gate 400. Epitaxial layer 402 is deposited to a thickness of about 10 nm to about 40 nm and is followed by an annealing step whereby the dopant of epitaxial layer 402 diffuses into fin 200. Annealing can be performed in a fast anneal tool such as a laser anneal or a rapid thermal anneal. These doped areas form the source and drain regions of the finFET device. FIG. 4B is a cross-sectional view of FIG. 4A taken through section line 4B-4B that shows epitaxial layer 402 deposited on portions of fin 200 in areas directly adjacent to dummy gate 400. It is to be appreciated by someone skilled in the art, that a spacer is not required on the sidewalls of dummy gate 400 based on the use of a dummy gate material such as SiN that does not initiate the epitaxial growth. The type of dopant is selected based on the type of MOSFET. For example, the source and drain regions of an nFET type of transistor are doped with a Group V material such as phosphorous, arsenic, or antimony. A suitable masking process using, for example silicon oxide, may be used to protect a pFET region during the selective epitaxial growth of an nFET region. Similarly, the source and drain regions of a pFET type of transistor are doped with a Group III material such as boron or indium. It is understood by someone skilled in the art that faceted epitaxial growth may be preferred because of improved electrical characteristics such as reduced parasitic capacitance. Faceted epitaxial growth can be accomplished with certain epitaxy conditions such as CVD with increased temperature and decreased pressure. FIG. 4D is a cross-sectional view of FIG. 4A taken through section line 4D-4D that shows the faceted growth of epitaxial layer 402 over fin 200.

Figure 5A:
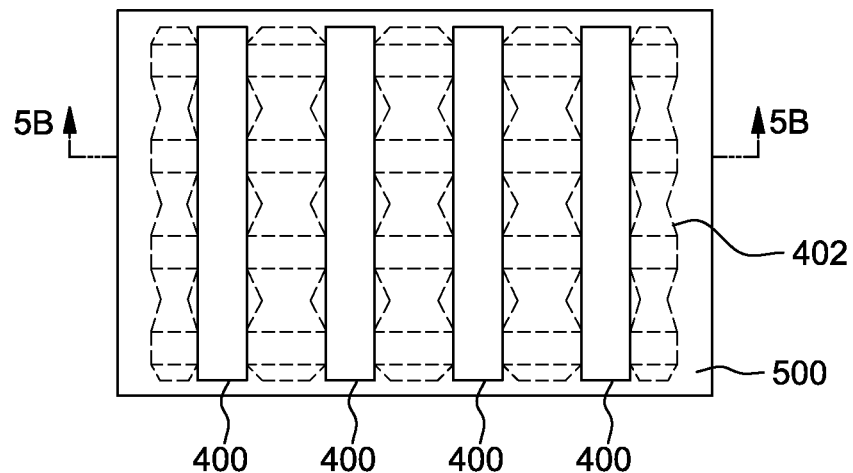
FIG. 5A depicts a planar view of the deposition of an insulator layer over an epitaxial layer of the finFET device, in accordance with an embodiment of the present invention.
Figure 5B:
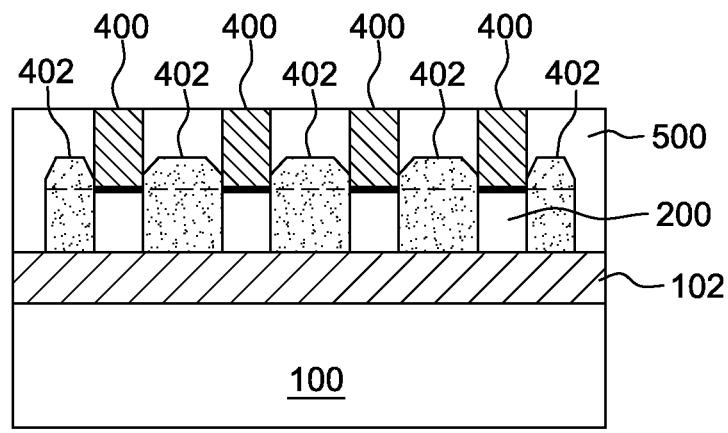
FIG. 5B is a cross-sectional view of FIG. 5A taken through section line 5B-5B that shows a deposited insulator layer over an epitaxial layer.

FIG. 5A depicts a planar view of the deposition of insulator layer 500 over epitaxial layer 402 of the finFET device, in accordance with an embodiment of the present invention. Insulator layer 500 can be any insulating material such as SiO2 deposited over epitaxial layer 402 and dummy gate 400 using, for example, CVD or ALD. In various embodiments of the invention, insulator layer 500 is deposited to a thickness greater than the thickness of dummy gate 400. The surface of insulator layer 500 can then be planarized using CMP. CMP can remove the top portion of insulator layer 500 to a height substantially coplanar to the top surface of dummy gate 400, thus exposing the top portion of dummy gate 400. FIG. 5B is a cross-sectional view of FIG. 5A taken through section line 5B-5B that shows the deposited insulator layer 500 over epitaxial layer 402, planarized to the top of dummy gate 400.

Figure 6A:
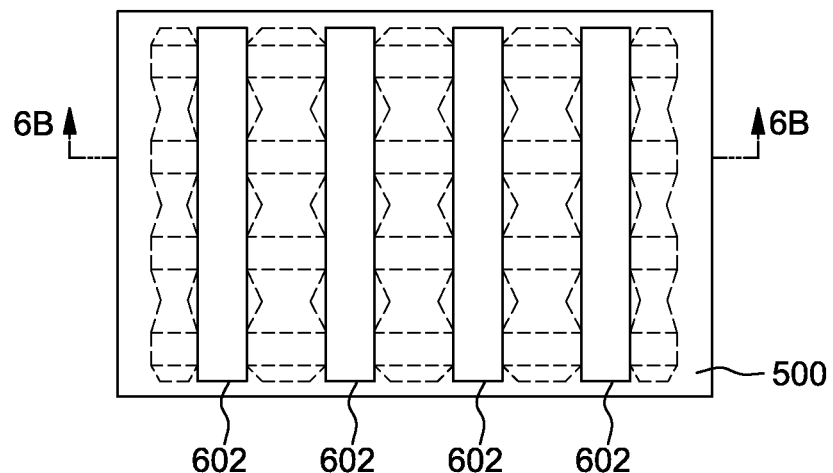
FIG. 6A depicts a planar view of the replacement metal gate of the finFET device, in accordance with an embodiment of the present invention.
Figure 6B:
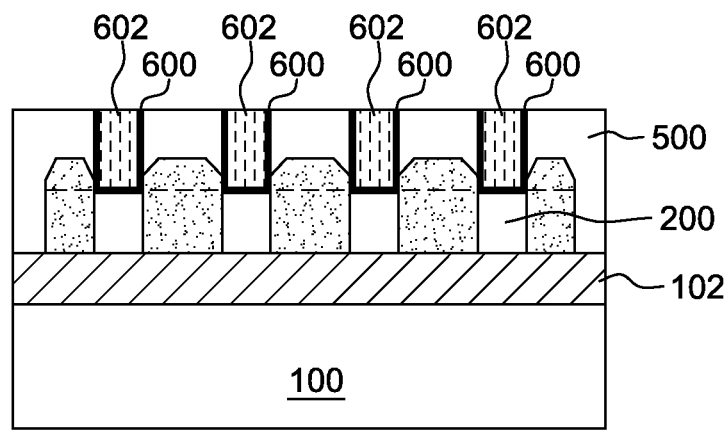
FIG. 6B is a cross-sectional view of FIG. 6A taken through section line 6B-6B that shows the removal of excess replacement gate materials from the surface of an insulator layer.

FIG. 6A depicts a planar view of the replacement metal gate (RMG) 602 of the finFET device, in accordance with an embodiment of the present invention. Dummy gate 400 of FIGS. 5A and 5B may be removed using a wet chemical etch, such as potassium hydroxide (KOH), or ammonium hydroxide (NH4OH), or a dry etch such as RIE, leaving a gate trench wherein the gate trench sidewalls include portions of epitaxial layer 402 and insulator layer 500. A stack of materials for RMG 602, known to someone skilled in the art, is deposited using, for example, CVD or ALD and may include a high-k dielectric material. In various embodiments, the RMG process starts with the deposition of high-k gate oxide layer 600 of a high-k dielectric material such as hafnium dioxide. High-k gate oxide layer 600 is deposited over the surface of insulator layer 500, the exposed sidewall of insulator layer 500, exposed portions of epitaxial layer 402 and exposed portions of fin 200. In various embodiments, RMG 602 may include various layers as determined by electrical performance requirements of the finFET device including a workfunction setting metal and a fill metal. The workfunction setting metal may be a material such as titanium nitride (TiN) or tantalum nitride (TaN) deposited over high-k gate oxide layer 600. The fill metal is deposited over the workfunction setting metal, filling the gate trench with, for example, tungsten (W) or aluminum (Al). The various layers and materials depicting the RMG process are presented as examples and are not meant to be limiting. FIG. 6B is a cross-sectional view of FIG. 6A taken through section line 6B-6B that shows the removal of excess replacement gate materials from the surface of insulator layer 500. For example, CMP may be used to remove the excess replacement gate materials that include high-k gate oxide layer 600 and the various layers of RMG 602 that are not in the gate trench, from the surface of insulator layer 500.

Figure 7A:
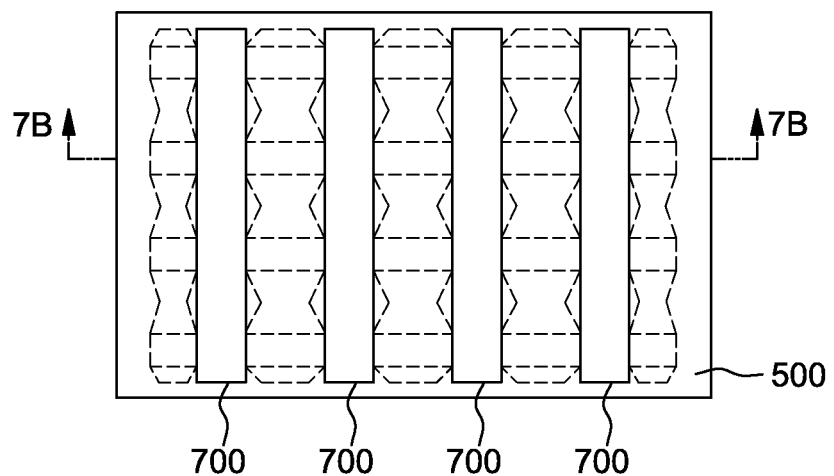
FIG. 7A depicts a planar view of a hard mask cap deposited over the replacement metal gate of the finFET device, in accordance with an embodiment of the present invention.
Figure 7B:
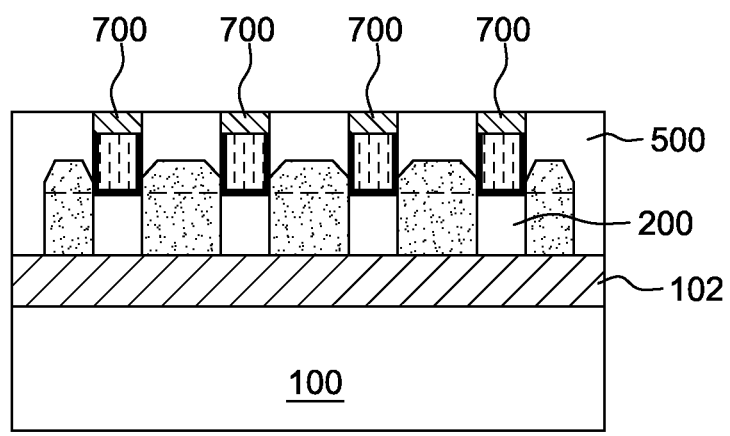
FIG. 7B is a cross-sectional view of FIG. 7A taken through section line 7B-7B that shows the removal of excess hard mask material from the surface of an insulator layer.

FIG. 7A depicts a planar view of hard mask cap 700 deposited over RMG 602 of the finFET device in accordance with an embodiment of the present invention. The hard mask cap 700 may be provided to insulate RMG 602 and to protect RMG 602 during subsequent processing, such as a contact etch, to form a self-aligned contact. RMG 602 can be recessed from the surface of insulator layer 500 using a timed etch, for example, a timed RIE. According to various embodiments, a hard mask material such as SiN is deposited on the surface of insulator layer 500, filling the recess created by the timed etch of RMG 602. FIG. 7B is a cross-sectional view of FIG. 7A taken through section line 7B-7B that shows the removal of excess hard mask material from the surface of insulator layer 500. A planarizing process, such as CMP, can be used to remove excess hard mask material from the surface of insulator layer 500 leaving hard mask cap 700 over RMG 602.

Figure 8A:
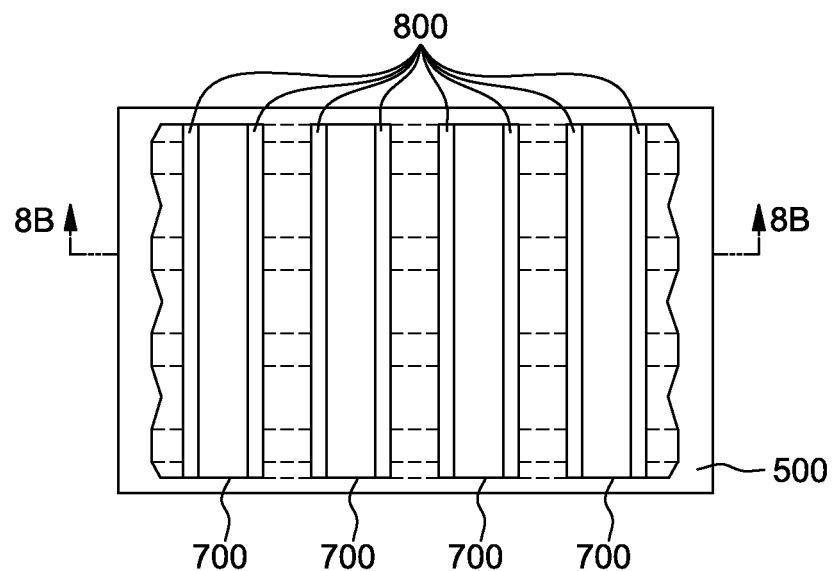
FIG. 8A depicts a planar view of the removal of at least a top portion of an insulator layer and the formation of a spacer, in accordance with an embodiment of the present invention.
Figure 8B:
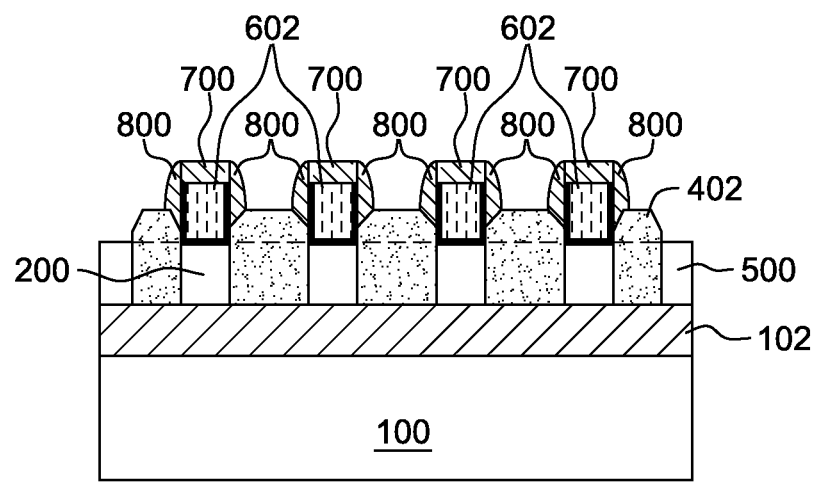
FIG. 8B is a cross-sectional view of FIG. 8A taken through section line 8B-8B that shows the formation of a spacer along the sidewall of a RMG and, at least a portion of an epitaxial layer.

FIG. 8A depicts a planar view of the removal of at least a top portion of insulator layer 500 and the formation of spacer 800, in accordance with an embodiment of the present invention. A timed etch using, for example, RIE can be used to remove at least the top portion of insulator layer 500, exposing the sidewalls of RMG 602. The sidewalls of RMG 602 are exposed to allow for the formation of spacer 800 on the sidewall of RMG 602 and, at least a portion of, epitaxial layer 402. In various embodiments, forming spacer 800 may include depositing a conformal layer (not shown) of insulating material, such as silicon nitride, over the finFET device including RMG 602, epitaxial layer 402, hard mask cap 700, and the remaining portions of insulator layer 500, such that the thickness of the deposited layer on the sidewall of RMG 602 is substantially the same as the thickness of the deposited layer on the surface of epitaxial layer 402 and insulator layer 500. An anisotropic etch process, wherein the etch rate in the downward direction is greater than the etch rate in the lateral directions, may be used to remove the insulating layer, thereby forming spacer 800. FIG. 8B is a cross-sectional view of FIG. 8A taken through section line 8B-8B that shows the formation of spacer 800 along the sidewall of RMG 602 and, at least a portion of, epitaxial layer 402.

Figure 9A:
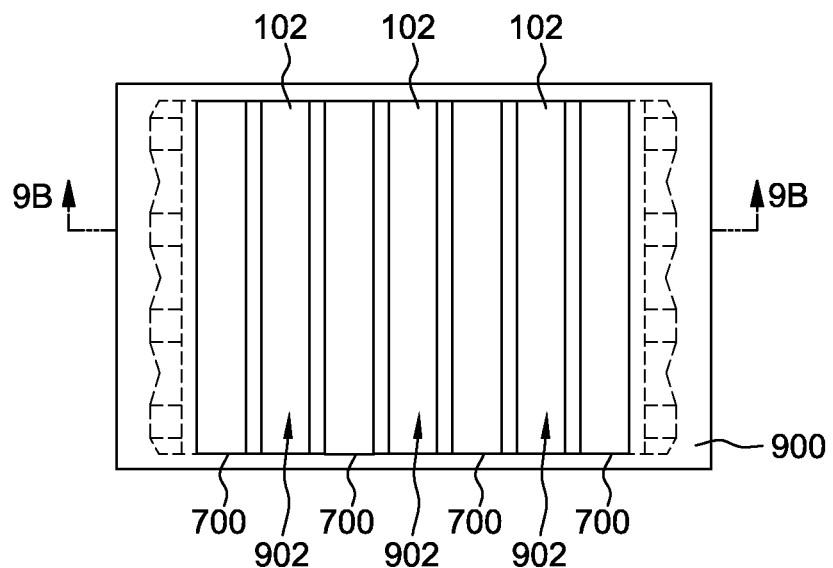
FIG. 9A depicts a planar view of the deposition of a second insulator layer followed by the formation of a contact opening, in accordance with an embodiment of the present invention.

FIG. 9A depicts a planar view of the deposition of second insulator layer 900 followed by the formation of contact opening 902, in accordance with an embodiment of the present invention. Second insulator layer 900 can be any insulating material such as SiO2 deposited over insulator layer 500, hard mask cap 700 over RMG 602, and spacer 800, using, for example, CVD or ALD. In various embodiments of the invention, second insulator layer 900 is deposited to a thickness greater than the thickness of RMG 602 plus hard mask cap 700. The top surface of second insulator layer 900 can then be planarized using chemical CMP. CMP can remove the top portion of second insulator layer 900 to a height substantially coplanar to the top surface of hard mask cap 700 over RMG 602, facilitating subsequent imaging processes.

Figure 9B:
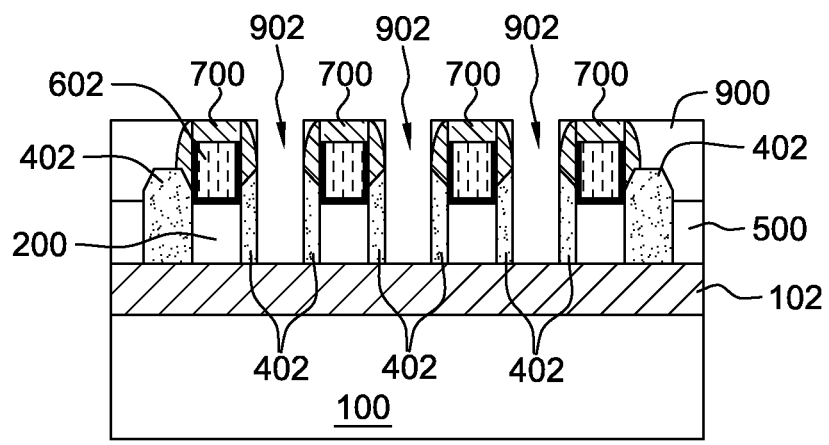
FIG. 9B is a cross-sectional view of FIG. 9A taken through section line 9B-9B that shows the formation of a contact opening.

Following the deposition and CMP of second insulator layer 900, contact opening 902 is formed. In various embodiments, standard lithographic processes are used to define the pattern of contact opening 902 in a layer of photoresist (not shown) deposited over second insulator layer 900 and hard mask cap 700. It can be appreciated by someone skilled in the art, that additional layers, such as a hard mask layer, may be included between the photoresist layer and second insulator layer 900 to facilitate the imaging and etch processes. FIG. 9B is a cross-sectional view of FIG. 9A taken through section line 9B-9B that shows the formation of contact opening 902. The formation of contact opening 902 is started by removing second insulator layer 900 and any remaining portions of insulator layer 500 from the areas not protected by the pattern in the photoresist layer, using for example RIE. Removal of second insulator layer 900 and the remaining portions of insulator layer 500 exposes epitaxial layer 402 and buried oxide layer 102. The exposed portions of epitaxial layer 402 which includes fin 200, can be removed using a dry etch, such as RIE, or a wet etch, such as tetramethylammonium hydroxide (TMAH) thereby exposing a sidewall of epitaxial layer 402 which includes fin 200, cut perpendicular to the direction of fin 200. In various embodiments, spacer 800 of FIG. 8, acts to further define contact opening 902 by acting as an additional etch mask, protecting the portions of epitaxial layer 402 and fin 200 under spacer 800, during the etching of epitaxial layer 402 and fin 200, and thereby self-aligning contact opening 902 with respect to gate 602 and spacer 800. In other embodiments, the pattern of contact opening 902 is defined by spacer 800 without the use of a lithographic process.

Figure 10A:
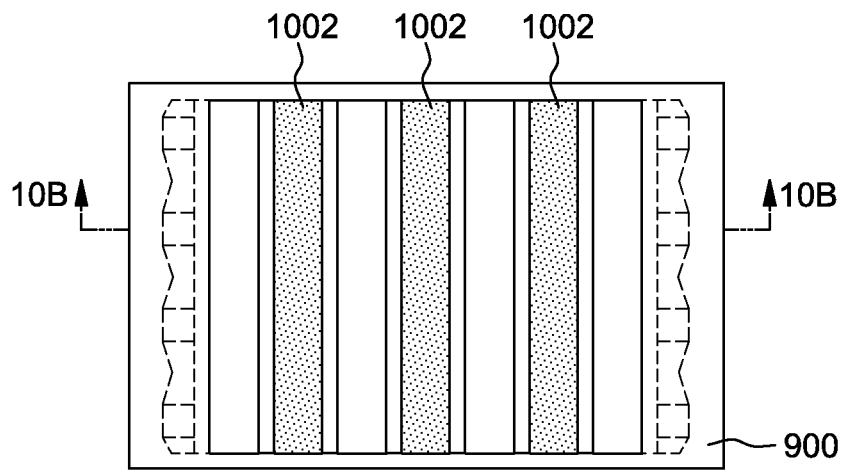
FIG. 10A depicts a planar view of the deposition of a source/drain contact, in accordance with an embodiment of the present invention.
Figure 10B:
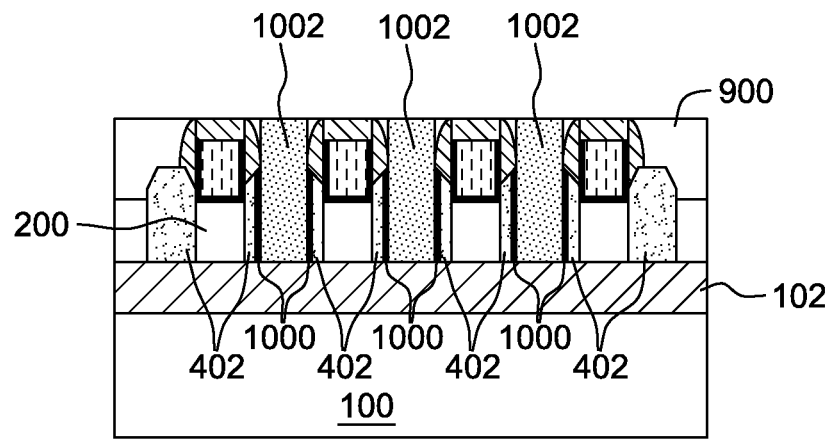
FIG. 10B is a cross-sectional view of FIG. 10A taken through section line 10B-10B that shows the removal of the excess contact metal.

FIG. 10A depicts a planar view of the deposition of source/drain contact (s/d contact) 1002, in accordance with an embodiment of the present invention. S/D contact 1002 is formed in previously created contact opening 902 of FIG. 9A-B. In various embodiments, a thin layer of metal silicide may be deposited on all exposed silicon surfaces, including the exposed portions of epitaxial layer 402, using, for example cobalt, tungsten or nickel, to form liner 1000. Contact opening 902 can then be filled by depositing a contact metal such as tungsten or aluminum. FIG. 10B is a cross-sectional view of FIG. 10A taken through section line 10B-10B that shows the removal of the excess contact metal. CMP may be used to remove the excess contact metal from the top surface of second insulator layer 900 resulting in s/d contact 1002 that connects to a perpendicular sidewall of epitaxial layer 402.

The resulting semiconductor device may be included on a semiconductor substrate consisting of many devices and one or more wiring levels to form an integrated circuit chip. The resulting integrated circuit chip(s) can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Having described preferred embodiments of a process variability tolerant hard mask design for a RMG finFET device (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A finFET device, the device comprising:
   a fin formed in a semiconductor substrate;
   a source/drain region formed over a portion of the fin;
   a gate structure formed over at least a portion of the fin, wherein the gate structure directly contacts a portion of the formed source/drain region;
   an insulating layer over at least a portion of the fin, the source/drain region and the gate structure;
   a spacer formed on at least a sidewall of the gate structure and over at least a portion of the source/drain region; and
   an opening in at least a portion of the insulating layer, at least a portion of the source/drain region, and at least a portion of the fin, wherein the opening is adjacent the gate structure, and wherein the opening comprises a pattern defined by the spacer.

2. The finFET device of claim 1, wherein the opening is filled with a contact material.

3. The finFET device of claim 1, wherein the gate structure includes a layer of high-k material and the high-k layer directly contacts the source/drain region.

4. The finFET device of claim 1, wherein the gate structure further includes a workfuntion material over the high-k layer.

5. A method of fabricating a semiconductor finFET device, the method comprising:
   providing a fin in a semiconductor substrate;
   forming a dummy gate over a portion of the fin, wherein the dummy gate does not initiate selective epitaxy;
   forming a source region and a drain region on at least a portion of the fin, wherein the source region and drain region directly contact the dummy gate;
   replacing the dummy gate with a replacement metal gate (RMG) structure, wherein the RMG structure directly contacts the source region and the drain region;
   forming a spacer on at least a sidewall of the RMB structure and over at least a portion of the source or at least a portion of the drain region; and
   replacing at least a portion of the fin, including at least a portion of the source region or at least a portion of the drain region, with a contact material, wherein replacing the at least a portion of the fin which includes at least a portion of the source region or at least a portion of the drain region includes creating an opening in the at least a portion of the fin which includes at least a portion of the source region or at least a portion of the drain region, wherein the opening comprises a pattern defined by the spacer.

6. The method of claim 5, wherein the dummy gate is SiN.

7. The method of claim 5, wherein the source and drain regions are formed using selective epitaxy.

8. The method of claim 5, wherein the RMG structure includes a gate oxide directly contacting at least a portion of the source and the drain regions.

9. The method of claim 8, wherein the gate oxide is a high-k dielectric.

* * * * *